United States Patent [19]
Acovic et al.

[11] Patent Number: 5,886,376
[45] Date of Patent: *Mar. 23, 1999

[54] EEPROM HAVING COPLANAR ON-INSULATOR FET AND CONTROL GATE

[75] Inventors: Alexandre Acovic, Mohegan Lake; Tak Hung Ning; Paul Michael Solomon, both of Yorktown Heights, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 673,974

[22] Filed: Jul. 1, 1996

[51] Int. Cl.$^6$ .................................................. H01L 29/788
[52] U.S. Cl. ............................ 257/316; 257/57; 257/66; 257/318; 257/347
[58] Field of Search .................................. 257/316–318, 257/347

[56] References Cited

U.S. PATENT DOCUMENTS 4,453,234  6/1984  Uchida ..................................... 257/347

*Primary Examiner*—Gene M. Munson
*Attorney, Agent, or Firm*—Whitham, Curtis & Whitham; Casey P. August, Esq.

[57] ABSTRACT

An electrically erasable programmable read-only memory CEEPROM) includes a field effect transistor and a control gate spaced apart on a first insulating layer, a second insulating layer formed over the field effect transistor and the control gate and a common floating gate on the second insulating layer over the channel of the field effect transistor and the control gate, the floating gate thus also forms the gate electrode of the field-effect transistor. The EEPROM devices may be interconnected in a memory array and a plurality of memory arrays may be stacked on upon another. The invention overcomes the problem of using a non-standard silicon-on-insulator (SOI) CMOS process to make EEPROM arrays with high areal density.

23 Claims, 4 Drawing Sheets

EEPROM HAVING COPLANAR ON-INSULATOR FET AND CONTROL GATE

FIELD OF THE INVENTION

This invention relates to semiconductor memories and, more particularly, to electrically erasable programmable read-only memories (EEPROMs).

BACKGROUND OF THE INVENTION

Silicon-on-insulator (SOI) technology has made great strides in recent years, and may possibly replace bulk silicon as the technology of choice for future VLSI circuits. SOI technology has dielectric isolation, rather than the twin tubs of conventional CMOS, and makes it practical to use the isolated silicon island as a circuit element.

The most commonly used EEPROMS use a floating gate and control gate (word line) elements in combination with programming either by hot-electron injection or by Fowler-Nordheim tunneling through a thin dielectric, and erasing by Fowler-Nordheim tunneling.

EEPROM cells may be fabricated using a standard CMOS process on bulk silicon without any additional processes. Such is described in a publication by K. Ohsaki et al., IEEE Journal of Solid State Circuits, Vol. 29, No. 3, p. 311, March 1994 entitled "A Single Poly EEPROM Cell Structure for Use in Standard CMOS Processes". The EEPROM cell consists of adjacently placed NMOS and PMOS transistors. The EEPROM cell uses only a single polysilicon layer which is patterned to provide a common polysilicon gate with respect to the NMOS and PMOS transistors. This polysilicon gate serves as the floating gate of the EEPROM cell. With bulk CMOS, this EEPROM implementation is very space consuming, requiring about 48 lithography squares, making the cell impractical for most applications.

The present state of the art in EEPROM design is represented, for example, in the publication by H. Kume et al. entitled "A 1.28 $\mu m^2$ Contactless Memory Cell Technology for a 3V-Only 64 Mbit EEPROM", in 1992 International Electron Devices Meeting, Technical Digest, p. 991. An EEPROM device consists of an n-channel field effect transistor having a floating gate of polysilicon and a control gate (word line) above the floating gate in a stack. The small cell area of 1.28 $\mu m^2$ is based on 0.4 $\mu m$ CMOS process (4 squares). The program/erase mechanism uses Fowler-Nordheim tunneling.

EEPROMs are useful for low power portable electronics and as microcodes for application specific integrated circuits (ASIC's) and for microprocessors.

SUMMARY OF THE INVENTION

The present invention relates to semiconductor devices, arrays of such devices and stacked arrays of such devices, suitable for electrically erasable programmable read-only memories (EEPROMs). The EEPROM device consists of a floating gate, a control gate, and an insulated-gate field-effect transistor (IGFET). Both the control gate and the FET are made from the same layer of semiconductor on an insulator layer. Being made from the same layer, the control gate and the FET are thus coplanar. The floating gate lies on top of both the control gate and the FET. The region of the floating gate on top of the FET thus also forms the gate electrode of the FET. The control gate is capacitively coupled to the floating gate.

The present invention, with both the FET and the control gate being co-planar and lying on an insulator surface, can be readily fabricated using the standard silicon-on-insulator (SOI) technology, where the silicon layer of the SOI wafer can be used to form both the control gate and the FET. Since the floating gate also forms the gate electrode of the FET, the fabrication process of this EEPROM device can also be used to fabricate other FETs which are not part of the EEPROM device. Thus, the present invention readily enables the integration of EEPROM devices of the present invention and standard SOI CMOS devices on the same chip.

The EEPROM device of the present invention can also be fabricated using polysilicon-on-insulator or amorphous silicon-on-insulator, with both the control gate and the FET made from a polysilicon layer or an amorphous silicon layer. Since polysilicon-on-insulator or amorphous silicon-on-insulator can be formed readily on top of standard CMOS integrated circuits, or on top of one another, multiple layers of arrays of EEPROM devices of the present invention may be stacked on top of one another. By stacking layers of arrays, the areal density of the EEPROM cells can be increased.

BRIEF DESCRIPTION OF THE DRAWING

These and other features, objects, and advantages of the present invention will become apparent upon a consideration of the following detailed description of the invention when read in conjunction with the drawings, in which.

DESCRIPTION OF THE PREFERRED EMBODIMENT

Figure 1:
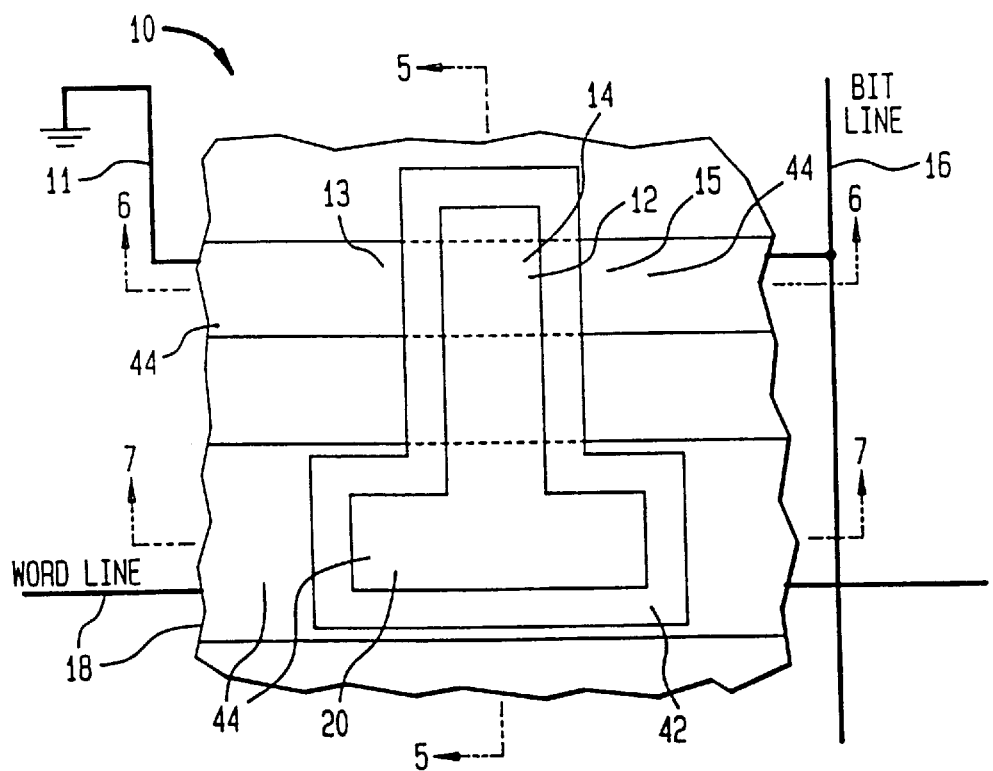
FIG. 1 is a top view of an EEPROM device illustrating one embodiment of the invention.

Referring to FIG. 1, a top view of an electrically erasable programmable read only memory (EEPROM) cell 10 is shown. EEPROM cell 10 includes field effect transistor (FET) 12 having a floating gate 14. The source 13 of FET 12 is coupled over lead 11 to a voltage potential such as ground and the drain 15 of FET 12 is coupled to bit line 16. Floating gate 14 extends over a word line 18 with an overlap area 20 sufficient to provide capacitive coupling of a predetermined value.

Figure 8:
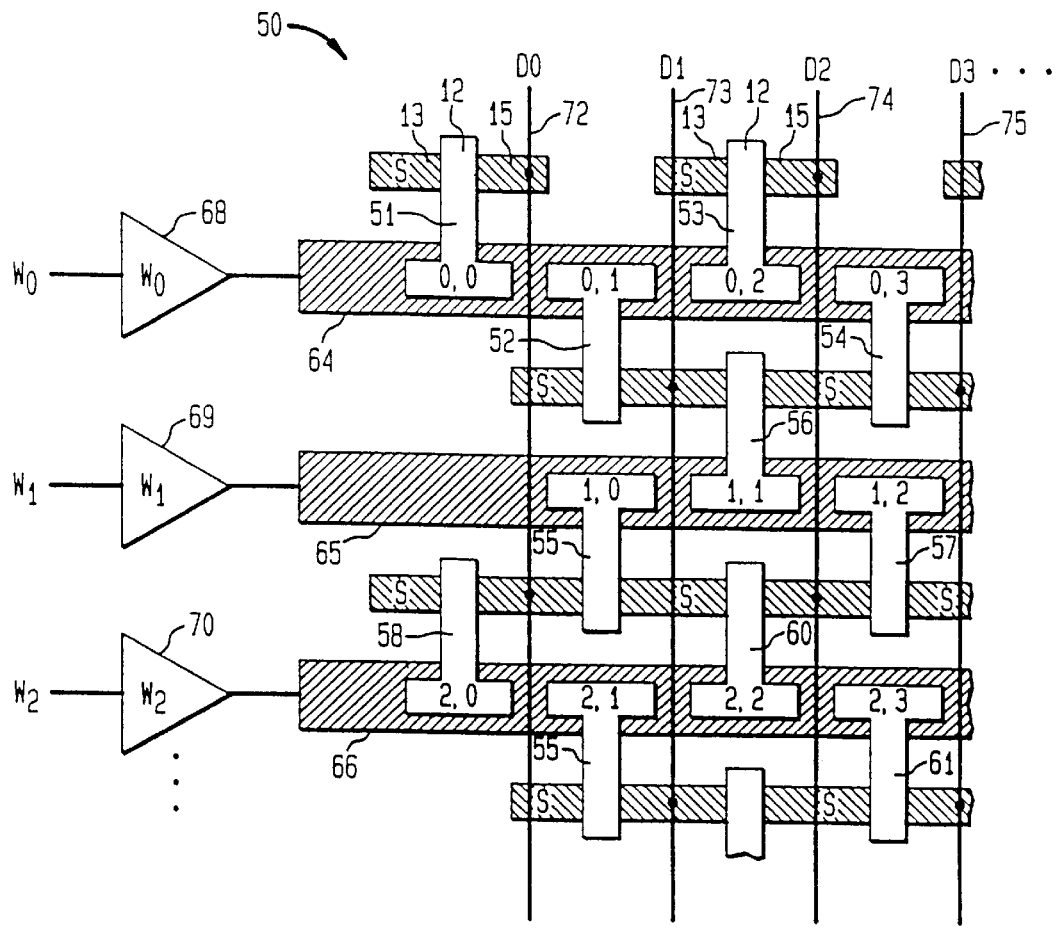
FIG. 8 is a top view of an array of EEPROM devices interconnected on one layer to form a memory.

A plurality of EEPROM cells 10 may be interconnected an array as shown in FIG. 8 to form an EEPROM array. The EEPROM cells may be arranged in columns and rows. EEPROM cells in a row are coupled to a respective word line. EEPROM cells in a column are coupled to a respective bit line.

Figure 2:
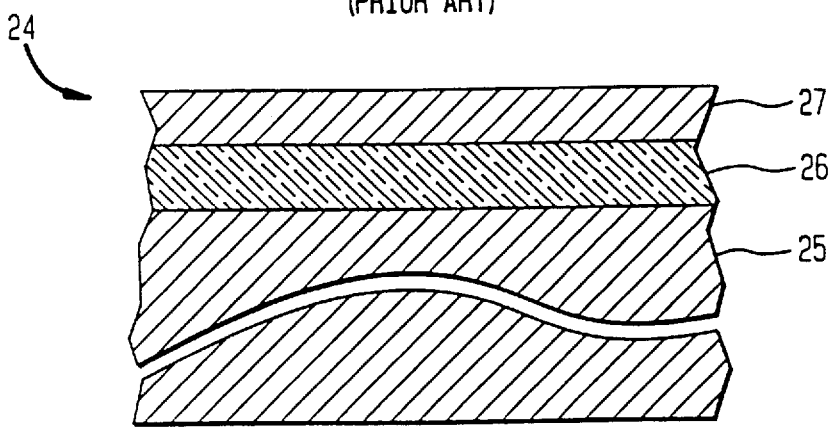
FIG. 2 is a cross section view of a SOI wafer.

An array of EEPROM cells may be fabricated on a silicon-on- insulator (SOI) wafer 24 such as shown in FIG. 2. A substrate 25 which may be for example silicon has an insulating layer 26 thereover which may be for example silicon dioxide. A semiconductor layer 27 which may be single crystal, polycrystalline or amorphous is positioned on insulating layer 26. Semiconductor layer 27 may be for example Si, Ge, SiC, SiGe, GaAs, GaN, InGaAs or InP. Wafer 24 may be fabricated by bond and etch back techniques. Bond and etch back consists of bonding a silicon wafer to another silicon wafer with one or both wafers having a layer of silicon dioxide thereon. One of the silicon wafers is then etched down to a thin layer. Or, wafer 24 may be fabricated by implantation of oxygen into a silicon wafer 25 and subsequently annealed to form a buried oxide layer. The process is known as separation by implantation of oxygen (SIMOX).

Figure 3:
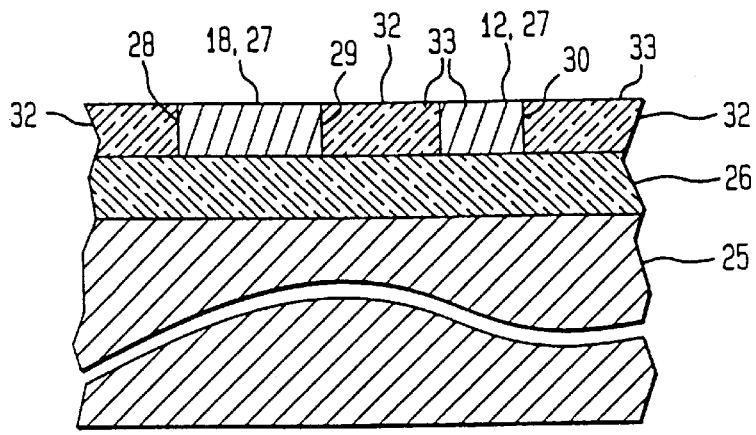
FIG. 3 is a cross section view of FIG. 1 along the line 5—5 at a first stage in the fabrication of the EEPROM device.

FIG. 3 shows a cross section view of FIG. 1 along the lines 5—5 at a first stage in fabrication before the gate oxide and subsequent layers are formed. Semiconductor layer 27 may be patterned to form first and second semiconductor regions that are spaced apart. The first region is for the source 13, drain 15 and channel region 39 of FET 12. The second region is for the control gate (word line 18). The openings 28, 29 and 30 in semiconductor layer 27 are filled with a dielectric for example silicon dioxide 32 such as by chemical vapor deposition (CVD). The upper surface of patterned semiconductor layer 27 and silicon dioxide 32 is polished such as by chemical mechanical polishing (CMP) to form a planar surface 33.

Source 13, drain 15 and the body of FET 12 and control gate (word line) 18 are doped p type such as for example to about $4 \times 10^{17}$. Control gate (word line) 18 may be doped heavily p++ such as for example to about $2 \times 10^{20}$ to reduce its resistance.

Figure 4:
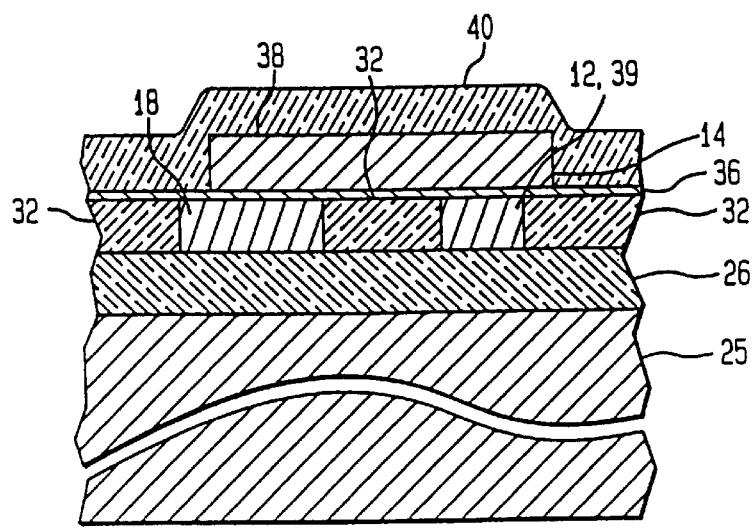
FIG. 4 is a cross section view of FIG. 1 along the line 5—5 at a second stage in the fabrication of the EEPROM device.

Next as shown in FIG. 4, a thin silicon dioxide layer 36 is formed for example by CVD to provide a gate insulator for FET 12.

Next, a layer 38 of polycrystalline semiconductor material which may be for example polysilicon is formed over a thin film insulator layer 36, which may be for example silicon dioxide, formed over patterned semiconductor layer 27. Layer 38 is subsequently patterned by lithographic techniques to form floating gate 14 as shown in FIGS. 1 and 4.

Using floating gate 14 as a mask, source 13 and drain 15 are doped n type by ion implantation such as for example to about $1 \times 10^{20}$ leaving the channel region 39 p type. Floating gate 14, acting as a mask, is also doped n type in the process.

Figure 5:
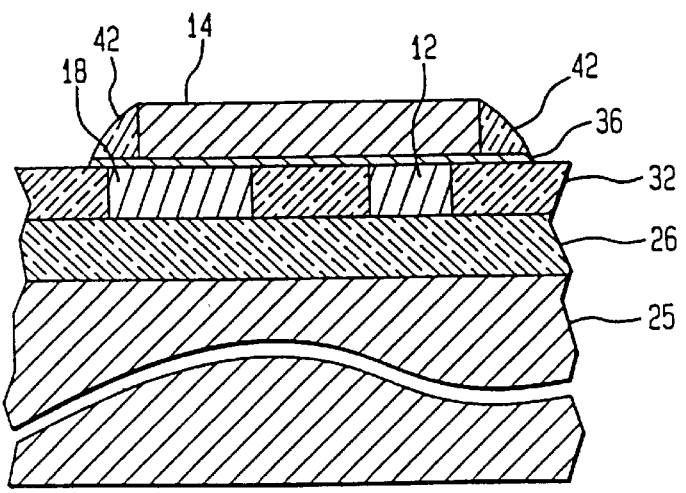
FIG. 5 is a cross-section view along the line 5—5 of FIG. 1 showing the FET, control gate (word line) and floating gate of the EEPROM device.

A layer 40 of dielectric which may be for example silicon nitride is formed over floating gate 14 and insulator layer 36. Layer 40 is subsequently etched such as by reactive ion etching (RIE) to form sidewalls 42 shown in FIG. 5.

Next, insulator layer 36 is etched through where not protected by floating gate 14 or sidewall 42 to expose the semiconductor material of control gate (word line) 18 and source 13 and drain 15 shown in FIG. 1. Next, a layer of refractory metal such as titanium is deposited over the exposed semiconductor material for example silicon of control gate (word line) 18, source 13, drain 15 and floating gate 14. The layer of refractory metal is annealed to form, for example, titanium silicide 44 on control gate (word line) 18, source 13, drain 15, and floating gate 14 as shown in FIGS. 1, 6 and 7.

Figure 6:
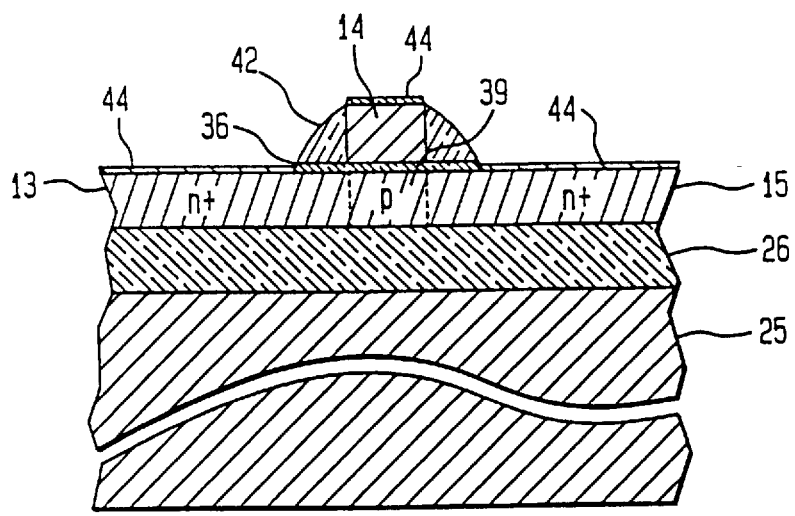
FIG. 6 is a cross-section view along the line 6—6 of FIG. 1 showing the FET.

FIG. 6 is a cross section view along the line 6—6 of FIG. 1. In FIG. 6, FET 12 may be fabricated on 200 nm thick semiconductor material. Silicon dioxide layer 36 may be 5 nm thick. Floating gate 14 may be about 200 nm thick.

Figure 7:
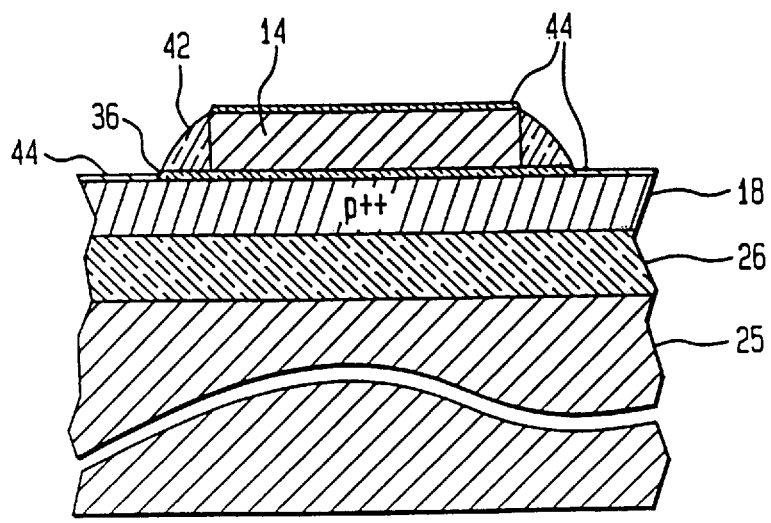
FIG. 7 is a cross-section view along the line 7—7 of FIG. 1 showing the control gate (word line).

FIG. 7 is a cross section view along the line 7—7 of FIG. 1. In FIG. 7, control gate (word line) 18 is made from the same semiconductor layer as FET 12.

FIG. 8 is a top view of an memory array 50 of EEPROM cells interconnected on one layer to form a random access memory. EEPROM cells 51–61 are arranged in rows and columns. The control gates (word lines) of EEPROM cells 51–54 are coupled in series to word line 64. The control gates (word lines) of EEPROM cells 55–57 are coupled in series to word line 65. The control gate (word lines) of EEPROM cells 58–61 are coupled in series to word line 66. Word lines 64–66 correspond to rows 0–2 in memory array 50 and carry control signals W0–W2 respectively. Word lines 64–66 are coupled to word line drivers 68, 69, and 70 which may be for example CMOS circuits. The source 13 of FETs 12 of each EEPROM cell is coupled to a predetermined voltage such as ground potential by way of a first metal wiring level (not shown). The drain 15 of FETs 12 of EEPROM cells 51, 55 and 58 are coupled to bit line 72. The source 13 of FETs 12 of EEPROM cells 52, 56 and 59 are coupled to bit line 73. The drain 15 of FETs 12 of EEPROM cells 53, 57 and 60 are coupled to bit line 74. The drain 15 of FETs cells 54 and 61 are coupled to bit line 75. Bit lines 72–75 correspond to columns 0–3 and carry data signals D0-D3 respectively. Bit lines 72–75 may be metal lines on a second wiring level and may contact the drain terminals of FETs in the column in the array by way of shared vias from the second wiring level to two FETs from adjacent rows.

A typical operation of the memory array 50 is as follows. To erase a bit, the word line is raised from 0 to 10 volts and the bit line is held at 0 volts. To program a "1", the word line is lowered from 0 to −7.5 volts and the bit line is raised from 0 to 2.5 volts. To program a "0", the word line is lowered from 0 volts to −7.5 volts and the bit line is held at 0 volts. To read data out, the word line of the selected cell is raised from 0 to 2.5 volts and the respective bit line is biased at a positive voltage for example 1 volt and the current through the selected bit line is measured using a suitable sense amplifier.

Figure 9:
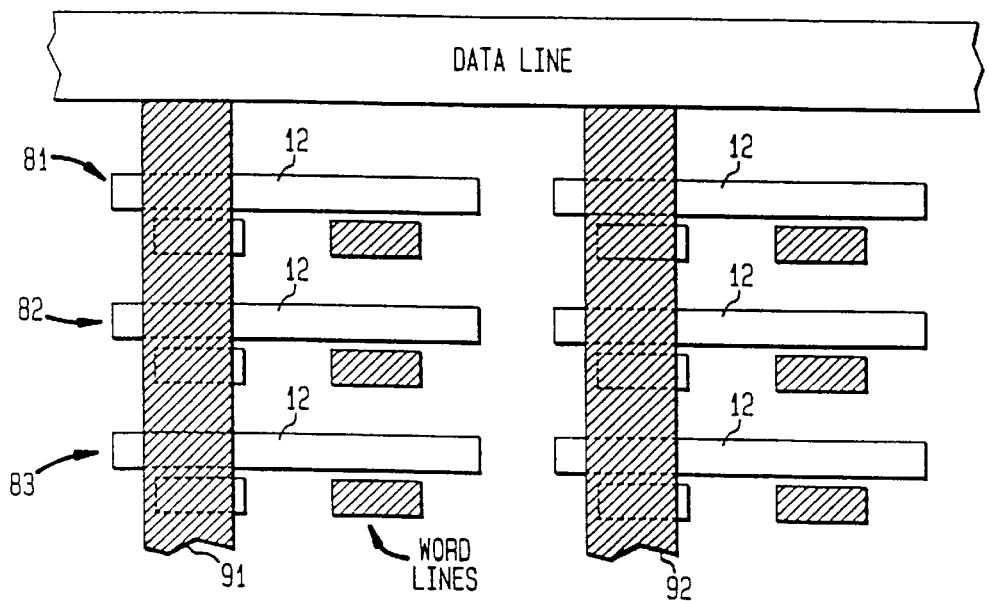
FIG. 9 is a cross-section view of a plurality of stacked layers of EEPROM devices interconnected between layers to form a memory.

FIG. 9 is a cross section view showing a plurality of stacked layers 81–83 where each layer may be a memory array similar to memory array 50 shown in FIG. 8. In FIG. 9, the word lines of each layer are accessed from the side of the array layer, as in FIG. 8 for one layer. The vias or studs 91 and 92 may contact all of the FETs 12 in a vertical column and then the vias or studs are connected in respective columns to form respective bit lines. Thus, a metal bitline for one of the memory cells on the upper-most memory array layer also serves as the bit line for all the memory cells belonging to the same vertical column, one cell from each of the lower memory array layers. An insulation layer not shown is formed above a stacked layer prior to forming the next memory layer thereover. Memory array 50 may be fabricated above a bulk silicon wafer or an SOI wafer.

While there has been described and illustrated an EEPROM array and stacked array containing EEPROM devices having a coplanar on-insulator FET and control gate or word line, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An electrically erasable programmable read-only memory (EEPROM) device comprising:

a floating gate having a planar surface;

a control gate being capacitively coupled to said floating gate; and an insulated-gate field-effect transistor having a gate electrode, said gate electrode being formed by said floating gate, said control gate and said insulated-gate field-effect transistor being made from the same layer of semiconductor material lying on a first insulating layer, wherein said insulated-gate field-effect transistor and said control gate are coplanar, a second insulating layer lying over a channel region of said insulated-gate field-effect transistor and said control gate, said floating gate lying over said second insulating layer over both said control gate and said channel region of said insulated-gate field effect transistor, said planar surface of said floating gate being parallel to said coplanar surfaces of said control gate and said insulated-gate field-effect transistor, and said second insulating layer having a same thickness between (i) said coplanar surface of said control gate and said planar surface of said floating gate and (ii) said coplanar surface of said insulated-gate field-effect transistor and said planar surface of said floating gate.

2. The EEPROM device of claim 1 wherein said layer of semiconductor material is a material selected from the group consisting of silicon, germanium, silicon carbide, silicon germanium, gallium arsenide, gallium nitride, indium gallium arsenide and indium phosphide.

3. The EEPROM device of claim 1 wherein said layer of semiconductor material is selected from the group consisting of single crystal, polycrystalline and amorphous semiconductor material.

4. The EEPROM device of claim 1 wherein said control gate and said insulated-gate field effect transistor are spaced apart on separate semiconductor islands formed by patterning said layer of semiconductor material.

5. The EEPROM device of claim 4 further including insulating material between said separate semiconductor islands.

6. The EEPROM device of claim 5 wherein said insulating material is substantially coplanar with said separate semiconductor islands.

7. The EEPROM device of claim 1 wherein the source and drain of said insulated-gate field-effect transistor is formed by ion implantation using said floating gate as a mask.

8. The EEPROM device of claim 1 wherein the perimeter of said floating gate has sidewalls along said perimeter of a dielectric material.

9. The EEPROM device of claim 8 further including a layer of refractory metal silicide on the upper surface of said floating gate and on the upper surface of said control gate and said insulated-gate field effect transistor exterior of said sidewalls to provide low ohmic resistance.

10. The EEPROM device of claim 4 wherein said floating gate lying over said control gate terminates interior of one or more edges of said semiconductor island whereby an upper surface of said semiconductor island is exposed around one or more edges of said floating gate.

11. The EEPROM device of claim 10 further including a layer of refractory metal silicide on the upper surface of said semiconductor island around one or more edges of said floating gate to permit low ohmic resistance when a plurality of control gates are coupled in series.

12. The EEPROM according to claim 1, wherein said floating gate extends over said control gate so as to provide a capacitive coupling having a predetermined value such that substantially a majority of programming voltage falls across said insulated-gate field-effect transistor.

13. The EEPROM according to claim 1, wherein said layer of semiconductor material comprises an only layer of semiconductor material for forming said field effect transistor and said control gate.

14. A memory including electrically erasable programmable read-only memory (EEPROM) devices, each of said EEPROM devices comprising:

a floating gate;

a control gate being capacitively coupled to said floating gate; and an insulated-gate field-effect transistor having a gate electrode, said gate electrode being formed by said floating gate, said control gate and said insulated-gate field-effect transistor being made from the same layer of semiconductor material lying on a first insulating layer, wherein said insulated-gate field-effect transistor and said control gate are coplanar, a second insulating layer lying over a channel region of said insulated-gate field-effect transistor and said control gate, said floating gate lying over said second insulating layer over both said control gate and said channel region of said insulated-gate field effect transistor, a first plurality of said EEPROM devices being arranged in a plurality of rows and columns to form a first memory array, the control gates of said EEPROM devices corresponding to one of said plurality of rows coupled in series to form a word line for selecting said row, wherein the drain of said insulated-gate field-effect transistor of one of said EEPROM devices from each of said plurality of rows are coupled in common to form a bit line, and a third insulating layer over said first plurality of said EEPROM devices, and a second plurality of said EEPROM devices on said third insulating layer arranged in a plurality of rows and columns to form a second memory array.

15. The memory of claim 14, wherein the source of said insulated-gate field-effect transistor of said plurality of EEPROM devices are coupled in common to a first voltage potential.

16. The memory of claim 14, wherein said bit line comprises a folded bit line with the drain of said insulated-gate field effect transistor of said EEPROM devices in a column in odd rows connected to a first conductor and in even rows connected to a second conductor, said first and second conductors extending substantially parallel to one another through said first memory array.

17. The memory of claim 14, further including at least one insulating layer over said second memory array, with a plurality of said EEPROM devices on each of said at least one insulating layer arranged in a plurality of rows and columns to form a third memory array.

18. The memory of claim 17, wherein said bit line connecting said drain of said insulated-gate field-effect transistor of said EEPROM device in the upper-most of said third memory array also connects said drain of said insulated-gate field-effect transistor of one of said EEPROM devices from each of said memory arrays below said third memory array, said EEPROM devices thus connected to said bit line being substantially vertically directly below one another.

19. The memory of claim 14, wherein said bit line connecting said drain of said insulated-gate field-effect transistor of said EEPROM device in said second memory array also connects said drain of said insulated-gate field-effect transistor of one of said EEPROM devices in said first memory array, said EEPROM devices thus connected being substantially vertically one above another.

20. The memory according to claim 14, wherein said floating gate extends over said control gate so as to provide a capacitive coupling having a predetermined value such that substantially a majority of programming voltage falls across said insulated-gate field-effect transistor.

21. The memory according to claim 14, wherein said layer of semiconductor material comprises an only layer of semiconductor material for forming said field effect transistor and said control gate.

22. A memory device for storing data comprising:

a substrate;

a layer of insulation over said substrate;

first and second semiconductor regions spaced apart on said layer of insulation, said spaces between said first and second semiconductor regions being filled with a first dielectric material;

a layer of second dielectric material formed over at least a portion of said first semiconductor region and over said second semiconductor region; and a layer of silicon formed on said layer of second dielectric and patterned to form a floating gate over said second semiconductor region and over a portion of said first semiconductor region, said floating gate having a planar surface, said first semiconductor region and said second semiconductor region being coplanar, wherein said planar surface of said floating gate is parallel to said coplanar regions of said first semiconductor region and said second semiconductor region such that said layer of second dielectric material has a same thickness in substantially all areas between said coplanar regions and said planar surface of said floating gate.

23. The memory device according to claim 22, wherein said first semiconductor region includes a source, drain and channel region of a field-effect transistor (FET) formed therein, and said second semiconductor region includes a control gate formed therein, and wherein said first and second semiconductor regions are formed by a same layer of semiconductor material, the same layer of semiconductor layer comprises an only layer of semiconductor material for forming said FET and said control gate.

* * * * *